United States Patent [19]
Iwai et al.

[11] Patent Number: 6,128,552
[45] Date of Patent: Oct. 3, 2000

[54] ANTI-VIBRATION APPARATUS AND METHOD

[75] Inventors: Isao Iwai; Shinji Wakui; Takehiko Mayama, all of Utsunomiya, Japan

[73] Assignee: Canon Kabushiki Kaisha, Tokyo, Japan

[21] Appl. No.: 08/963,816

[22] Filed: Nov. 4, 1997

[30] Foreign Application Priority Data

Nov. 8, 1996 [JP] Japan .................................... 8-313015
Dec. 6, 1996 [JP] Japan .................................... 8-340446

[51] Int. Cl.$^7$ ............................ F16F 15/02; G05D 19/00
[52] U.S. Cl. ........................... 700/280; 248/550; 318/651
[58] Field of Search ..................... 700/280, 60; 248/550;
108/136; 73/663, DIG. 11; 188/378; 318/632,
649, 651, 677

[56] References Cited

U.S. PATENT DOCUMENTS 5,478,043 12/1995 Wakui ..................................... 248/550
5,545,962  8/1996 Wakui ..................................... 318/677
5,568,032 10/1996 Wakui ..................................... 318/632
5,750,897  5/1998 Kato ......................................... 73/663

FOREIGN PATENT DOCUMENTS 5-263868 10/1993 Japan .
6-235439  8/1994 Japan .
7-83276   3/1995 Japan .

*Primary Examiner*—William Grant
*Assistant Examiner*—Steven R. Garland
*Attorney, Agent, or Firm*—Fitzpatrick, Cella, Harper & Scinto

[57] ABSTRACT

An anti-vibration apparatus has a feedback loop based on vibration information from an anti-vibration table, and a feedforward loop based on vibration information from a setting foundation. A compensation mechanism in the feedforward loop uses an adaptive filter. The adaptive filter sequentially sets parameters in the compensation mechanism on the basis of the vibration information form the anti-vibration table and setting foundation. The vibration information consists of vibration component information indicating vibrations in units of motion directions, and a determination mechanism and an operation switching mechanism arranged at the input side of the adaptive filter select the vibration component information and supply the selected information to the adaptive filter.

7 Claims, 16 Drawing Sheets

F I G. 1
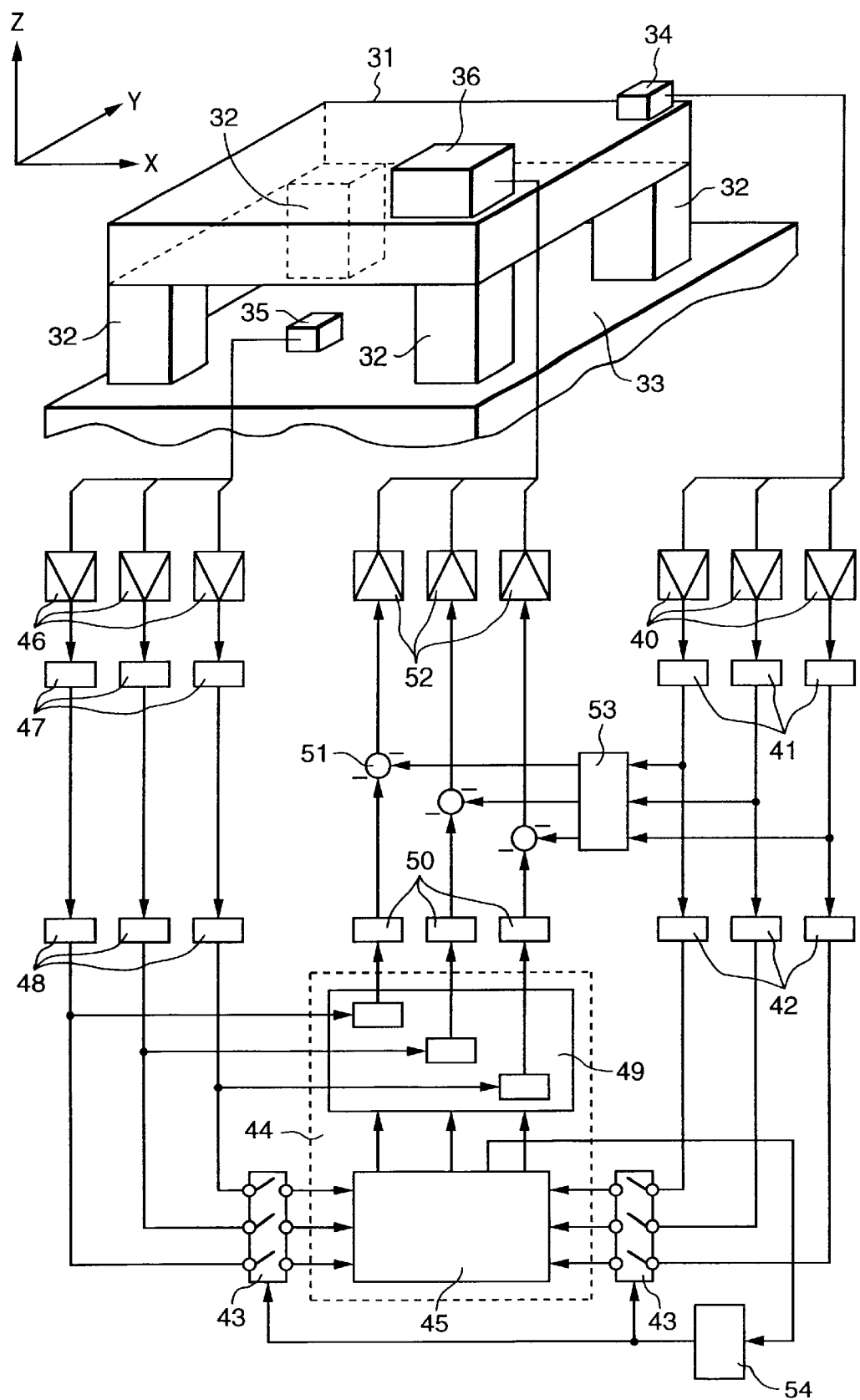

F I G. 10
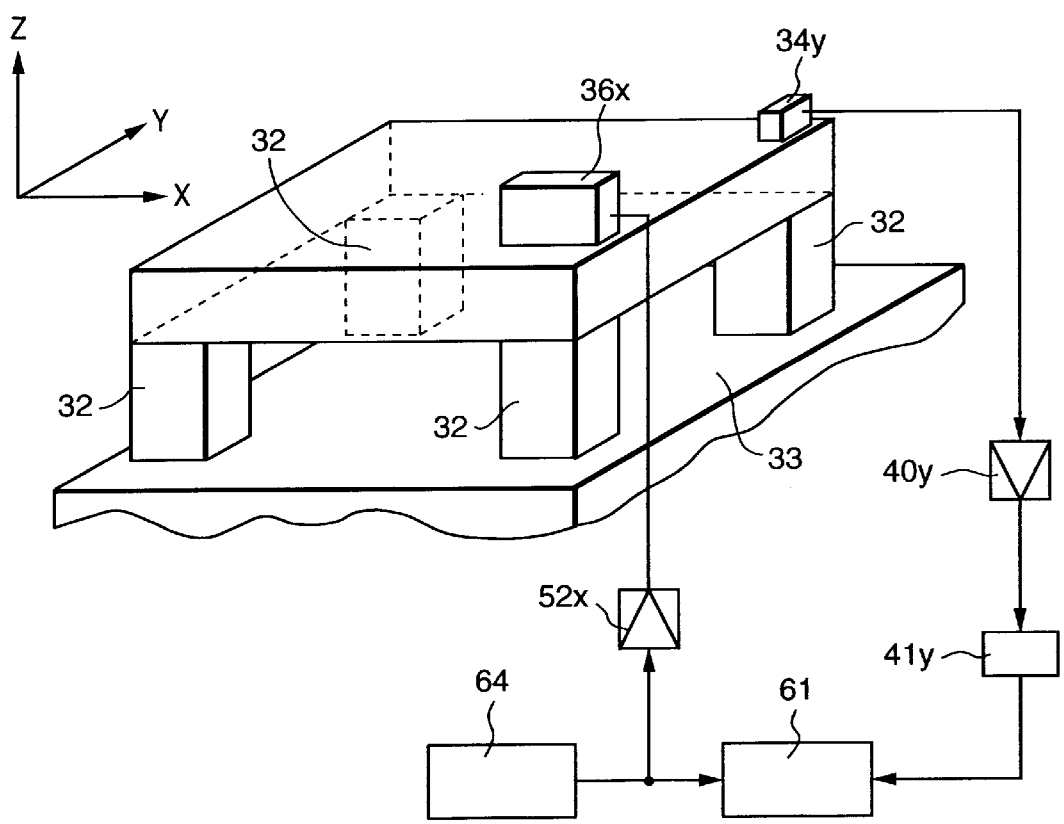

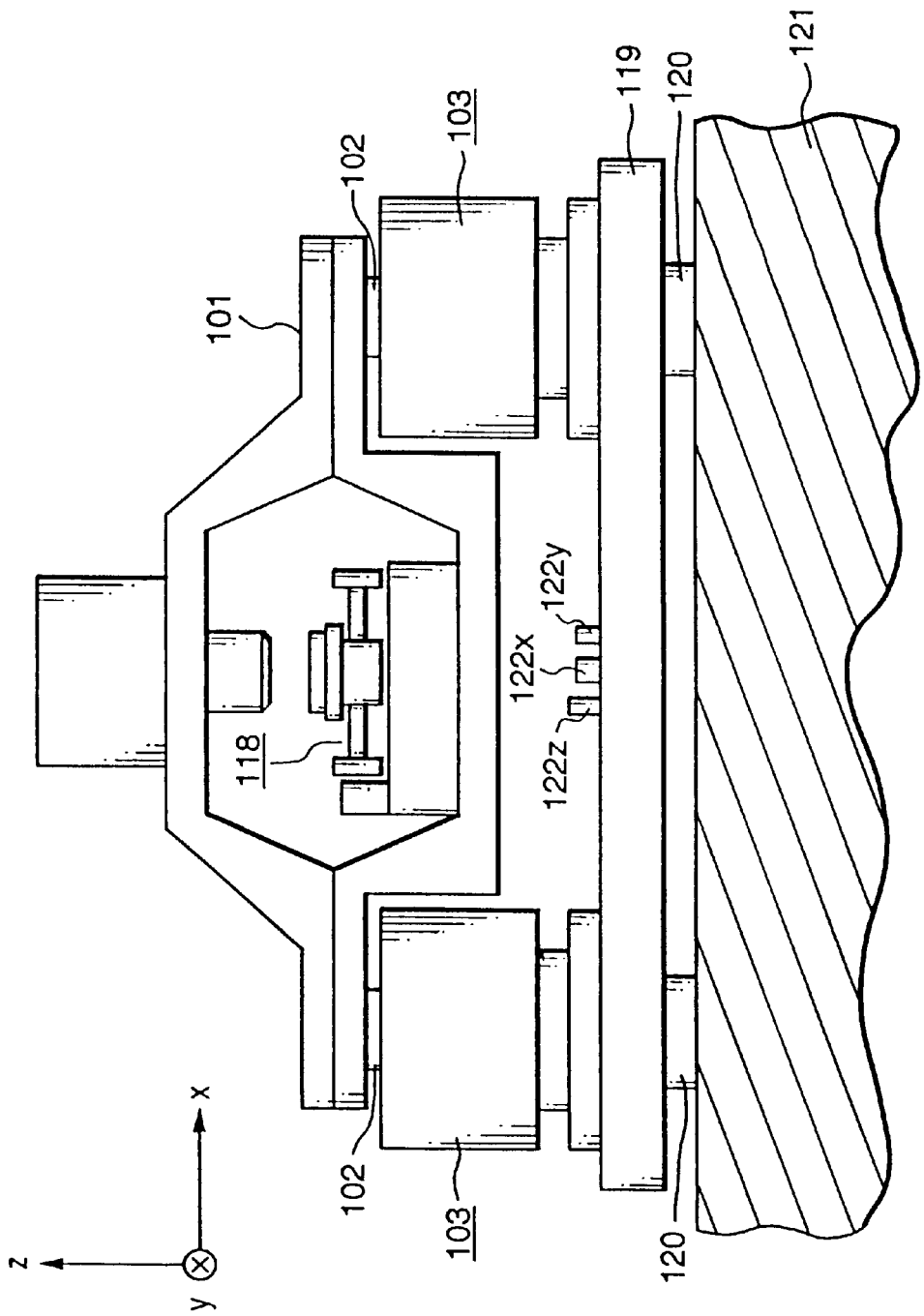

6,128,552

ANTI-VIBRATION APPARATUS AND METHOD

BACKGROUND OF THE INVENTION

The present invention relates to an active anti-vibration apparatus or vibration damping apparatus which mounts precision equipment such as an electron microscope, semiconductor exposure device, and the like, and can remarkably improve the transmission characteristics of vibrations from a setting foundation such as a floor as compared to a conventional apparatus.

The present invention relates to an active anti-vibration apparatus with a floor vibration feedforward function of suppressing vibrations that reach an anti-vibration table which carries a precision equipment via mechanism members of a plurality of damper support legs which support the anti-vibration table.

In general, precision equipment that is vulnerable to vibrations are mounted on an anti-vibration table. For example, an optical microscope, an X-Y stage for exposure, and the like are mounted. Especially, the X-Y stage for exposure must be mounted on the anti-vibration table from which external vibrations are removed as much as possible, so as to realize proper and quick exposure. This is because exposure must be done in a perfectly stand-still state of the X-Y stage for exposure. Furthermore, it is noted that the X-Y stage for exposure has, as its operation mode, intermittent motions called step & repeat motions, and produces repetitive step vibrations, which induce vibrations of the anti-vibration table. When such vibrations remain unsettled, it is impossible to start exposure. Hence, the anti-vibration table is required to realize an anti-vibration function against external vibrations, and a vibration control function of forcible vibrations caused by motions of the mounted equipment itself with a good balance.

In recent years, in place of a step & repeat type semiconductor exposure device that irradiates exposure light onto a silicon wafer mounted on the X-Y stage after the stage perfectly comes to a halt, a scan type semiconductor exposure device that irradiates exposure light onto a silicon wafer while scanning an X-Y stage and the like has also come into existence. Likewise, an anti-vibration table used in such device is required to achieve an anti-vibration function against external vibrations and a vibration control function of forcible vibrations caused by motions of the mounted precision equipment with a good balance.

An anti-vibration method includes active and passive methods.

In one active vibration control method, an adaptive digital filter is arranged to have vibration information of a vibration source as a reference input and vibration information of the object to be vibration-damped as an error input, and is used for implementing feedforward control. Such method is popularly used in suspension control for vehicles and the like. Since this vibration control method uses a digital feedforward compensator, it can automatically derive and realize appropriate characteristics of the compensator by its own adaptive operations in correspondence with the characteristics of an anti-vibration table even when the characteristics of the object to be vibration-damped are unknown. This control method is very effective today since a discrete arithmetic device such as a DSP (digital signal processor) can be easily used. As a vibration control method using the DSP, a "vibration control method and apparatus" disclosed in Japanese Patent Laid-Open No. 6-235439 or the like has been proposed.

FIG. 14 is a diagram showing the arrangement of a general anti-vibration apparatus. An anti-vibration table 1 that carries a precision equipment is set on a setting foundation 3 via support mechanisms 2. A first vibration detector 4 for detecting vibration information in two horizontal directions (X- and Y-directions) and a vertical direction (Z-direction) is arranged on the anti-vibration table 1, and a second vibration detector 5 for similarly detecting vibration information in the three directions is arranged on the setting foundation 3. Also, an actuator 6 for generating vibrating forces in the two horizontal directions and vertical direction is arranged on the anti-vibration table 1.

The three components output from the first vibration detector 4 are input to a parameter estimation mechanism 14 in an adaptive filter 13 via amplifiers 10, band-pass filters 11, and A/D converters 12. Also, the three components output from the second vibration detector 5 are input to the parameter estimation mechanism 14 and feedforward compensators 18 in the adaptive filter 13 via amplifiers 15, band-pass filters 16, and A/D converters 17. The three outputs from the parameter estimation mechanism 14 are connected to the actuator 6 via the feedforward compensators 18, D/A converters 19, mixing circuits 20, and drivers 21. The outputs from the band-pass filters 11 on the first vibration detector 4 side are also input to the mixing circuits 20 via a feedback compensator 22.

The first vibration detector 4 detects vibrations of the anti-vibration table 1, and the amplifiers 10 amplify the obtained detection signals. Thereafter, the band-pass filters 11 pass only components in a necessary frequency band to obtain vibration information. The feedback compensator 22 arithmetically operates the obtained vibration information, and feeds back the arithmetic operation result to the actuator 6 via the mixing circuits 20 and the driver 21. On the other hand, the second vibration detector 5 detects vibrations of the setting foundation 3, and the amplifiers 15 amplify the obtained detection signals. Thereafter, the band-pass filters 16 pass only components in a necessary frequency band to obtain vibration information. The adaptive filter 13 arithmetically operates the obtained vibration information, and inputs obtained manipulated variables to the drivers 21, thus driving the actuator 6.

In the above-mentioned vibration control method, not only the vibrations of the anti-vibration table 1 are detected by the vibration detector 4, and the output signals from the detector 4 are subjected to compensation and fed back to the actuator 6 that applies control forces to the anti-vibration table 1, but also the vibrations of the setting foundation 3 are subjected to appropriate compensation and fed forward to the actuator 6. According to the above-mentioned vibration control method, the insulating performance of vibrations from the setting foundation 3 can be greatly improved, and the vibration standard of the setting foundation 3 is relaxed.

As an example of the feedforward compensator, for example, as in a "floor vibration disturbance control method for an anti-vibration table" disclosed in Japanese Patent Laid-Open No. 5-263868, some characteristics of an active anti-vibration apparatus including those of an actuator are actually measured to implement a compensator. The reference discloses a method of deriving optimal characteristics of a feedforward compensator on the basis of the shake test response of the anti-vibration table using the actuator of the active anti-vibration apparatus and the vibration transmittance from the setting foundation to the anti-vibration table.

However, in the above-mentioned anti-vibration apparatus, interference components are produced and superposed on vibrations in the two horizontal directions and vertical direction depending on the attachment and center of gravity of the actuator 6. For this reason, when the convergence rates of the estimated parameters of the anti-vibration table 1 in the individual directions vary in units of directions, the transition of a given estimated parameter may influence parameter estimation in other directions. As a consequence, the parameters do not converge or diverge, thus deteriorating the anti-vibration performance.

In the above-mentioned active anti-vibration apparatus, the actuator 6 generates control forces to cancel vibrations in the two horizontal directions and vertical direction. However, depending on the attachment position of the actuator 6 and the center of gravity of the anti-vibration apparatus, interference components in other directions are produced, thus deteriorating the anti-vibration performance.

As described above, the anti-vibration table is classified into passive and active tables. In recent years, in order to meet requirements of high-precision positioning, high-precision scanning, high-speed movement, and the like for an equipment mounted on the anti-vibration table, active anti-vibration apparatuses have proliferated. As an actuator used in such apparatus, a pneumatic spring, voice coil motor, piezoelectric element, and the like are known. An active anti-vibration apparatus using a pneumatic spring as an actuator will be explained in detail below.

FIG. 15 shows a damper support leg using a pneumatic spring as an actuator. In FIG. 15, reference numeral 101 denotes an anti-vibration table that carries a precision equipment such as an X-Y stage and the like; and 102, a fastening plate for fastening a damper support leg 103 to the anti-vibration table 101. The internal mechanism of the damper support leg 103 is as follows. Reference numeral 104V (H) denotes a vertical (horizontal) driving pneumatic spring; 105V (H), a vertical (horizontal) vibration sensor; 106V (H), a vertical (horizontal) position sensor; 107V (H), a vertical (horizontal) servo valve; 108, laminated rubber; 109, a horizontal pilot pressure mechanical spring; and 110, a casing. Note that the vibration sensor normally comprises an acceleration sensor.

The arrangement of a feedback device for the damper support leg 103 with the above-mentioned mechanism members will be explained below. Reference numeral 111 denotes a filter circuit for converting signals output from the vibration sensors 105V and 105H into electrical signals and appropriately filtering the electrical signals; 112, a voltage-current (VI) converter 112 for supplying currents to the servo valves 107V and 107H; 113, a position detector for converting the outputs from the position sensors 106V and 106H into electrical signals; 114, a target voltage setting unit; 115, a error amplifier; and 116, a PI compensator. These elements make up a feedback device 117. Note that P means proportional, and I integral. FIG. 15 illustrates only the feedback device 117 for the horizontal direction, but a feedback device for the vertical direction has the same arrangement. Furthermore, in general, the anti-vibration table 101 is supported using a plurality of damper support legs 103, and feedback devices 117 are arranged in correspondence with the vertical and horizontal directions of each damper support leg.

In addition to the above-mentioned loop arrangement which comprises the feedback devices 117 in correspondence with the plurality of damper support legs 103, an arrangement disclosed in Japanese Patent Laid-Open No. 7-83276 is known. This reference discloses the arrangement of a control loop based on general motions, i.e., translation and rotation, of the Adanti-vibration table 101. Since servo adjustment can be done in units of motion modes such as translation and rotation, the position control of the anti-vibration table can be made precisely, and consequently, the performance of a precision equipment mounted on the anti-vibration table 101 can be fully utilized. Japanese Patent Application No. 8-19238 ("active anti-vibration apparatus and active anti-vibration method") discloses an apparatus arrangement which adopts, as a basic control arrangement, closed loops in units of motion modes, and performs so-called "floor vibration feedforward compensation in units of motion modes". In this compensation, a plurality of vibration sensors are set on a floor, floor vibrations are extracted in units of motion modes from these sensor outputs, and signals obtained by performing appropriate compensation of these extracted floor vibrations are fed forward.

Conveniently, floor vibration feedforward adopts loop structures in units of motion modes in correspondence with the frameworks of the closed loops, which support the anti-vibration table in a stable position, in units of motion modes, and such apparatus arrangement has an excellent feature that the anti-vibration ratios can be adjusted in units of motion modes without any interferences. In a conventional method, floor vibrations are represented by the measurement value of a vibration sensor arranged at one position, and this output is subjected to appropriate compensation and fed forward to actuators of the individual axes. However, the above-mentioned apparatus arrangement that feeds forward floor vibrations in units of motion modes has greatly superior anti-vibration ratio characteristics to the conventional method.

However, in order to further improve the anti-vibration ratio, the fact that floor vibrations enter the vibration table that carries a precision equipment via the damper support legs as routes must be taken into consideration. Vibrations that reach the anti-vibration table are traced back to floor vibrations. To suppress transmitted vibrations, vibrations concentrated at the foot of each damper support leg must be considered. That is, floor vibrations are transmitted to a device setting foundation member which fixes each damper support leg to vibrate it, and the vibrations enter the damper support leg of each axis from its foot, thus vibrating the anti-vibration table which carries a precision equipment.

If the device setting foundation member is rigid and the member is assumed to be integrated with a floor in a required anti-vibration frequency band, identical vibrations can be detected independently of the attachment position of the vibration sensor on the floor or on the device setting foundation member. However, in practice, since the device setting foundation member itself is not rigid and the contact state between the member and the floor is not uniform depending on its position, the vibration level when floor vibrations have traveled to the device setting foundation member normally becomes larger than that of the floor itself. On the other hand, when the mounted precision equipment is accelerated/decelerated, each damper support leg generates a driving force against a counterforce to apply a vibrating force to the device setting foundation member at its foot. With this force, the member which is not rigid statically deforms, or in many cases, local vibrations are produced. The trouble is that such local vibrations vibrate the anti-vibration table via the corresponding damper support leg again. Since these vibrations are local, the vibration entry state varies in units of damper support legs.

FIG. 16 shows the arrangement of a conventional semiconductor exposure device that adopts floor vibration feedforward compensation. In FIG. 16, the anti-vibration table 101 that carries an X-Y stage 118 as a precision equipment is rigidly connected to the damper support legs 103 via the fastening plates 102, and is supported by a device setting foundation member 119. Reference numeral 120 denotes leveling mechanisms for adjusting the height and inclination of the entire apparatus on the device setting foundation member 119.

In general, vibration sensors 122x, 122y, and 122z for detecting vibrations in the vertical axis and the two horizontal axes are set on, e.g., a single central portion of the device setting foundation member 119 so as to execute floor vibration feedforward control for suppressing transmission of vibrations on a floor 121 to the anti-vibration table 101. Alternatively, vibration sensors 122 as many as the required number of axes are arranged on an appropriate single portion on the floor 121. Note that x, y, and z indicate the coordinate axes in FIG. 16, which agree with the vibration measurement axes. That is, the outputs from the vibration sensors arranged on a single portion on the device setting foundation member 119 or floor 121 represent vibrations transmitted to the anti-vibration table 101. Signals obtained by appropriate compensation of these outputs are fed forward to actuators in the plurality of damper support legs 103 that support the anti-vibration table 101, thereby improving the anti-vibration ratio. The vibration measurements of the vibration sensors 122x, 122y, and 122z are done under the assumption that vibrations on the floor 121 and the device setting foundation member 119 as vibration sources remain the same independently of positions.

However, in practice, attenuation of vibrations over distance vary depending on the position of a vibrating source such as a power machine or the like with respect to the apparatus shown in FIG. 16 and, hence, the vibration state also differs depending on the position on the floor 121. Since the leveling mechanisms 120 and the device setting foundation member 119 are not rigid, the members 119, 120, and 121 do not vibrate integrally in fact upon directly receiving vibrations of the floor 121. Furthermore, it is also noted that the damper support legs 103 strongly kick the device setting foundation member 119 since the anti-vibration table is maintained at a predetermined position against a counterforce produced upon accelerating/decelerating the X-Y stage 118. At this time, the device setting foundation member 119 which is not rigid statically distorts, and dynamically excites local vibrations near the feet of the damper support legs 103.

In consideration of the above-mentioned phenomenon, in the conventional floor vibration feedforward compensation using vibration measurement signals obtained at a single position on the device setting foundation member 119 or floor 121, vibrations which are transmitted from the feet of the damper support legs to the anti-vibration table 101 cannot be removed more effectively. Also, an apparatus arrangement that extracts the motion mode of floor vibrations using a plurality of vibration sensors arranged on the floor and feeds forward the extracted motion mode has been proposed. However, such arrangement cannot adequately suppress local vibrations of the device setting foundation member, which are produced upon acceleration or deceleration of the precision equipment mounted on the anti-vibration table and are transmitted via the damper support legs.

The transmission routes of floor vibrations to the anti-vibration table that carries the precision equipment include mechanism members that make up the damper support legs of the individual axes. Furthermore, normally, each damper support leg is placed on the device setting foundation member. That is, since the mechanical vibration mode of the device setting foundation member is also present, a marked improvement of anti-vibration performance cannot be expected even when floor vibrations are measured at a single position on the floor or device setting foundation member and are fed forward to actuators of the individual axes via appropriate compensators as in the prior art.

SUMMARY OF THE INVENTION

It is an object of the present invention to provide an active anti-vibration apparatus which can solve the above-mentioned problems, can greatly improve the vibration transmission characteristics from a setting foundation such as a floor as compared to the prior art, and has high anti-vibration performance.

It is another object of the present invention to provide an anti-vibration apparatus which can quickly set the parameters of feedforward compensators at optimal values independently of the presence of interferences among the individual motion directions, and can provide sufficient anti-vibration performance.

It is still another object of the present invention to provide sufficient anti-vibration performance by exploiting a simple decoupling loop that can cancel interferences among a plurality of motion directions.

According to one aspect of the present invention, there is provided an anti-vibration apparatus having an actuator for damping vibration of an anti-vibration table, comprising: generation means for generating a driving signal of the actuator on the basis of vibration information indicating vibration of the anti-vibration table and vibration of a foundation portion on which the anti-vibration table is set; control means for controlling a parameter used for generating the driving signal in the generation means on the basis of the vibration information; and switching means for switching information to be referred to by the control means in the vibration information.

It is still another object of the present invention to optimally shield floor vibrations in units of damper support legs that support an anti-vibration table.

In order to achieve the above object, the fact that floor vibrations enter an anti-vibration table via the feet of the damper support legs is noted. That is, the present invention comprises vibration sensors as many as the degrees of freedom in driving of actuators of each damper support leg in the neighborhood of the foot of the damper support leg, and independently feeds forward their output signals to the neighboring actuators by appropriate compensation of these signals in units of damper support legs.

More specifically, an active anti-vibration apparatus which has an anti-vibration table that carries precision device, a plurality of active damper support legs for supporting the anti-vibration table, and decoupling feedback devices in units of motion modes for the plurality of damper support legs, comprises, in units of damper support legs, vibration sensors as many as degrees of freedom in driving of each damper support leg, which sensors are arranged in the neighborhood of the feet of the damper support legs, and floor vibration feedforward compensators for performing appropriate compensation of the outputs from the vibration sensors, and feeds forward the outputs from the floor vibration feedforward compensators to the input stages of drivers for driving the actuators of the individual damper support legs.

As described above, floor vibrations enter the anti-vibration table via the feet of the damper support legs of the individual axes. Hence, the present invention detects vibrations in the neighborhood of the feet of the damper support legs, appropriately compensates the detection outputs, and feeds forward these neighboring actuators. That is, since vibrations that enter each of a plurality of damper support legs in different states can be individually and optimally canceled, vibration components which enter the anti-vibration table as a whole can be consequently reduced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the descriptions, serve to explain the principle of the invention.

FIG. 1 is a block diagram showing the arrangement of an active anti-vibration apparatus according to the first embodiment of the present invention;

FIG. 10 is an explanatory view of procedure 2 for obtaining decoupling compensation characteristics;

FIG. 16 is a sectional view showing the arrangement of a conventional semiconductor exposure device that adopts floor vibration feedforward compensation.

DETAILED DESCRIPTION OF THE PREFERRED EMBODIMENTS

Figure 2:
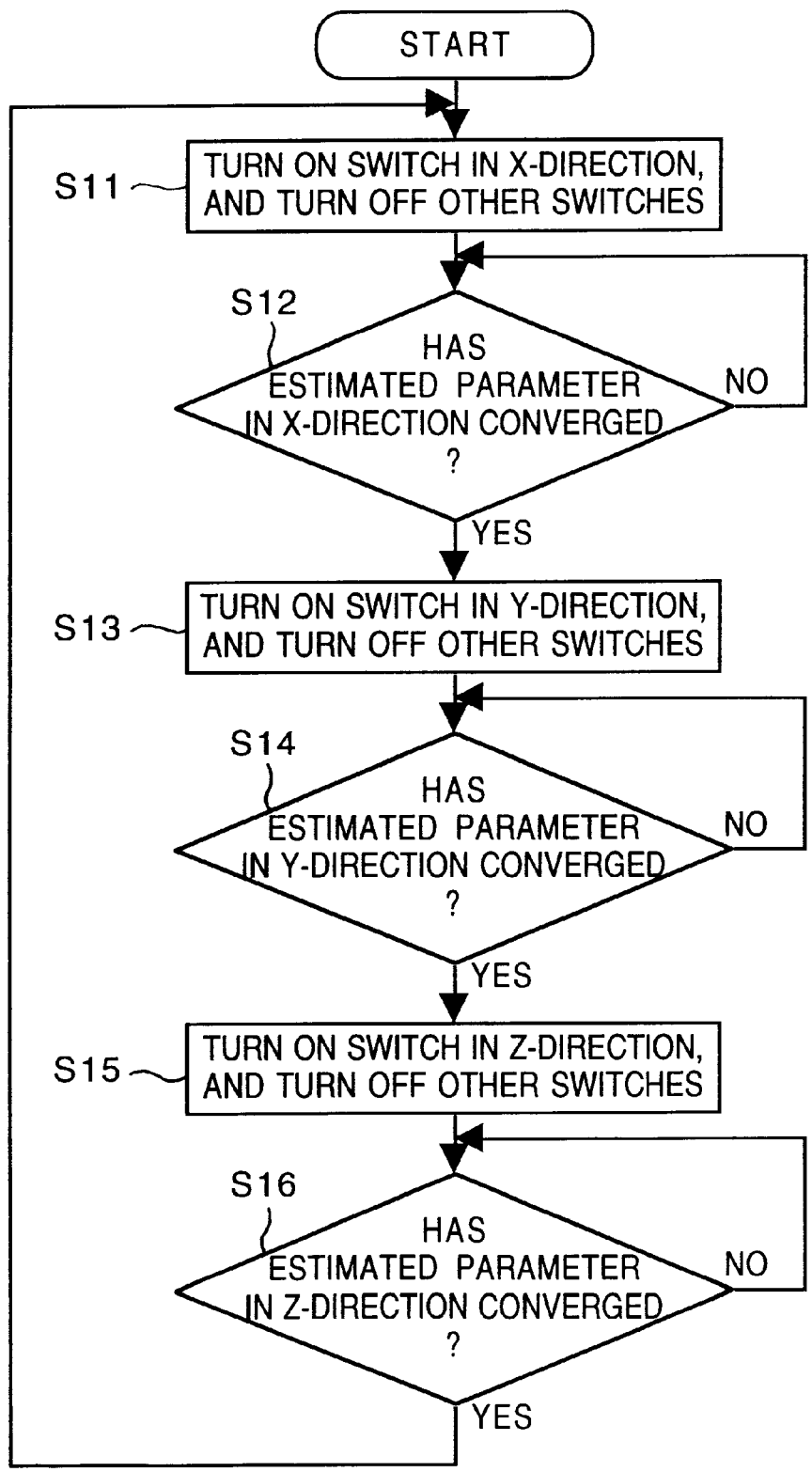
FIG. 2 is a flow chart for explaining the processing of a determination mechanism.

Preferred embodiments of the present invention will now be described in detail in accordance with the accompanying drawings.

<First Embodiment>

FIG. 1 is a block diagram showing the arrangement of an anti-vibration apparatus according to the first embodiment. An anti-vibration table 31 which carries a precision device is arranged on a setting foundation 33 via support mechanisms 32. A first vibration detector 34 for detecting vibration information in two horizontal directions (X- and Y-directions) and in a vertical direction (Z-direction) is arranged on the anti-vibration table 31, and a similar second vibration detector 35 is arranged on the setting foundation 33. An actuator 36 for generating vibrating forces in the two horizontal directions and vertical direction is arranged on the anti-vibration table 31.

The three components output from the first vibration detector 34 are input to a parameter estimation mechanism 45 of an adaptive filter 44 via amplifiers 40, band-pass filters 41, A/D converters 42, and an operation switch mechanism 43. Also, the three components output from the second vibration detector 35 are similarly input to the parameter estimation mechanism 45 of the adaptive filter 44 via amplifiers 46, band-pass filters 47, A/D converters 48, and another operation switch mechanism 43. The three outputs from the parameter estimation mechanism 45 are connected to the actuator 36 via a feedforward compensator 49, D/A converters 50, mixing circuits 51, and drivers 52.

The outputs from the band-pass filters 41 are input to the mixing circuits 51 via a feedback compensator 53, and the outputs from the A/D converters 48 are input to the feedforward compensator 49 of the adaptive filter 44. Furthermore, the outputs from the parameter estimation mechanism 45 are input to a determination mechanism 54, which controls the operation switching mechanisms 43 on the basis of these outputs.

This active anti-vibration apparatus is made up of an anti-vibration table vibration feedback loop for performing vibration control in consideration of vibrations of the anti-vibration table 31, and a floor vibration feedforward loop for performing vibration control in consideration of vibrations transmitted from the setting foundation 33 to the anti-vibration table 31.

In the anti-vibration table vibration feedback loop, the first vibration detector 34 having, e.g., acceleration sensors detects vibrations of the anti-vibration table 31 vibration-damped by the support mechanisms 32. The amplifiers 40 amplify the detection signals output from the detector 34, and the band-pass filters 41 pass only components in a necessary frequency band to obtain vibration information. The feedback compensator 53 arithmetically operates the obtained vibration information, and feeds back the operation results to the actuator 36 via the drivers 52.

On the other hand, in the floor vibration feedforward loop, the second vibration detector 35 detects vibrations of the setting foundation 33. The amplifiers 46 amplify the detection signals output from the detector 35, and the band-pass filters 47 pass only components in a necessary frequency band to obtain vibration information. The A/D converters 48 then convert the obtained vibration information into digital signals, which are converted into feedforward control signals via the feedforward compensator 49 in the adaptive filter 44. These control signals are converted into analog signals by the D/A converters 50, and the analog signals are output. The drivers 52 drive the actuator 36 on the basis of these output signals.

The second vibration detector 35 can use acceleration sensors, but the present invention is not limited to such specific sensors. For example, the second vibration detector 35 may calculate signals equivalent to acceleration signals of the setting foundation 33 on the basis of signals from the first vibration detector 34 and signals from displacement sensors for detecting relative displacements between the setting foundation 33 and the anti-vibration table 31.

The parameter estimation mechanism 45 sets the parameters of the feedforward compensator 49 on the basis of the vibration information of the anti-vibration table 31 detected by the first vibration detector 34, and the vibration information of the setting foundation 33 detected by the second vibration detector 35. The parameters of the feedforward compensator 49 are sequentially adjusted by the parameter estimation mechanism 45.

The operation switching mechanisms 43 select one of three pieces of vibration information in the X-, Y-, and Z-directions to be supplied to the parameter estimation mechanism 45. The determination mechanism 54 determines the vibration information to be selected by the operation switching mechanisms 43 on the basis of the estimated parameter transition output from the parameter estimation mechanism 45, and controls switching of the operation switching mechanisms 43. In this manner, the determination mechanism 54 and the operation switching mechanisms 43 control the vibration information to be supplied to the parameter estimation mechanism 45, thereby controlling parameter estimation by the parameter estimation mechanism 45. The feedforward compensator 49 is optimally controlled in this manner.

For example, the determination mechanism 54 monitors the estimated parameter transition, and when it determines that the estimated parameter in a predetermined direction has converged, the mechanism 54 controls the operation switching mechanism 43 to start estimation of the parameter in the next direction. For example, initially, estimation in the X-direction alone is started, but estimation in the Y- or Z-direction is not done. When the determination mechanism 54 determines that the estimated parameter in the X-direction has converged, estimation in the Y-direction is commenced. Furthermore, when the estimated parameter in the Y-direction has converged, estimation in the X-direction is started. The estimation start order is not limited to the above-mentioned order, but can be arbitrarily selected.

FIG. 2 is a flow chart showing an example of the above-mentioned processing by the determination mechanism 54. The determination mechanism 54 controls the operation switching mechanisms 43 to supply the vibration information in the X-direction alone of the anti-vibration table 31 and the setting foundation 33 to the parameter estimation mechanism 45, so as to perform estimation in only the X-direction (step S11). The determination mechanism 54 monitors the transition of the estimated parameter output from the parameter estimation mechanism 45, and checks if the estimated parameter in the X-direction has converged (step S12).

If the determination mechanism 54 determines that the estimated parameter in the X-direction has converged, estimation in the Y-direction is then started. That is, the determination mechanism 54 controls the operation switching mechanisms 43 to supply the vibration information in the Y-direction alone of the anti-vibration table 31 and the setting foundation 33 to the parameter estimation mechanism 45, so as to perform estimation in only the Y-direction (step S13). Thereafter, the determination mechanism 54 monitors the transition of the estimated parameter output from the parameter estimation mechanism 45, and checks if the estimated parameter in the Y-direction has converged (step S14).

If it is determined that the estimated parameter in the Y-direction has converged, estimation in the Z-direction is done in the same manner as described above (steps S15 and S16). Parameter estimation based on the vibration information in units of directions is repeated.

In this manner, since the vibration information to be supplied to the parameter estimation mechanism 45 can be controlled, the influence of interferences among a plurality of directions can be reduced, and the parameters of the feedforward compensator 49 can be satisfactorily set.

Since a precision device and the like are mounted on the anti-vibration table 31, actuators may be built in the support mechanisms 32 so as not to influence mounting of the precision device and the like. In this case, the outputs from the drivers 52 are connected to the actuators in the support mechanisms 32, as shown in FIG. 3.

Figure 3:
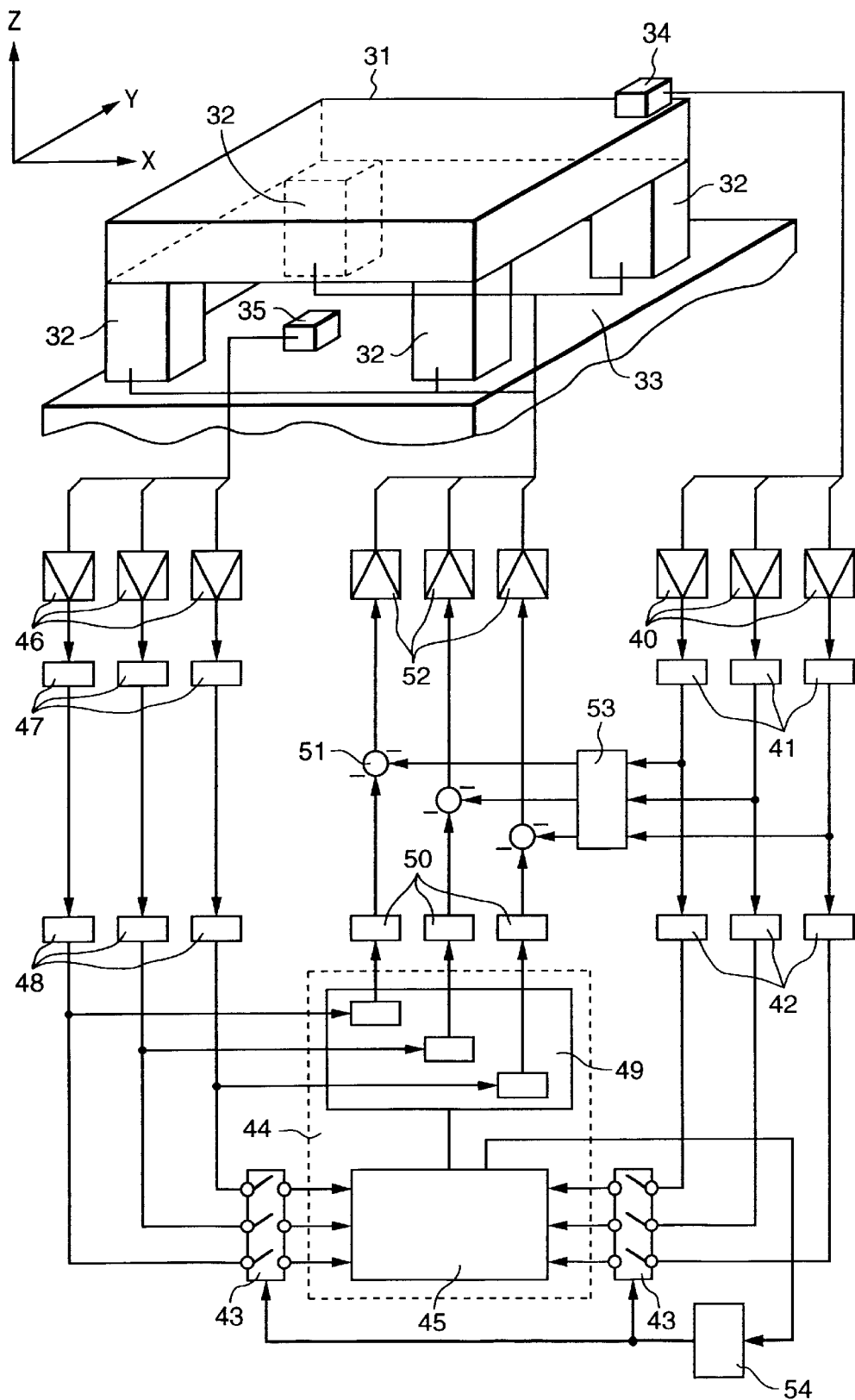
FIG. 3 is a block diagram showing the arrangement of a first modification.
Figure 4:
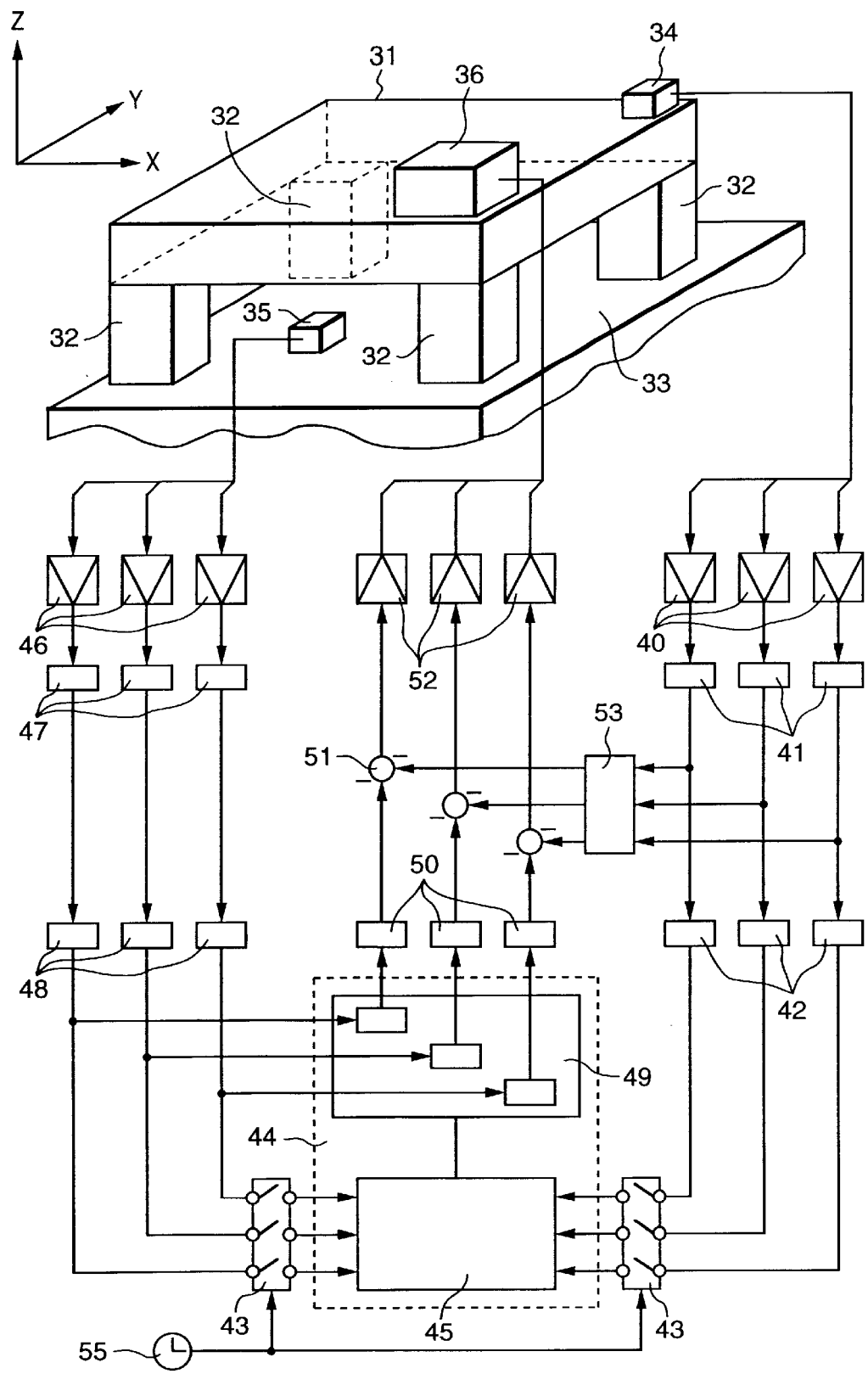
FIG. 4 is a block diagram showing the arrangement of a second modification.

Note that identical driving signals are supplied to the four support mechanisms 32 in FIG. 3, but the present invention is not limited to this. For example, control loops shown in FIG. 3 may be arranged in units of support mechanisms. When the convergence times of the parameters in the individual directions are known in advance, the operation switching mechanisms 43 may be switched by a determination mechanism 55 comprising timers in place of the determination mechanism 54, as shown in FIG. 4.

In this case, the determination mechanism 55 operates as follows. Timers corresponding to the respective directions are started at the processing timings of steps S11, S13, and S15 in the flow chart in FIG. 2, and the processing can branch to the YES side in steps S12, S14, and S16 upon detection of time-up of the corresponding timers.

Figure 5:
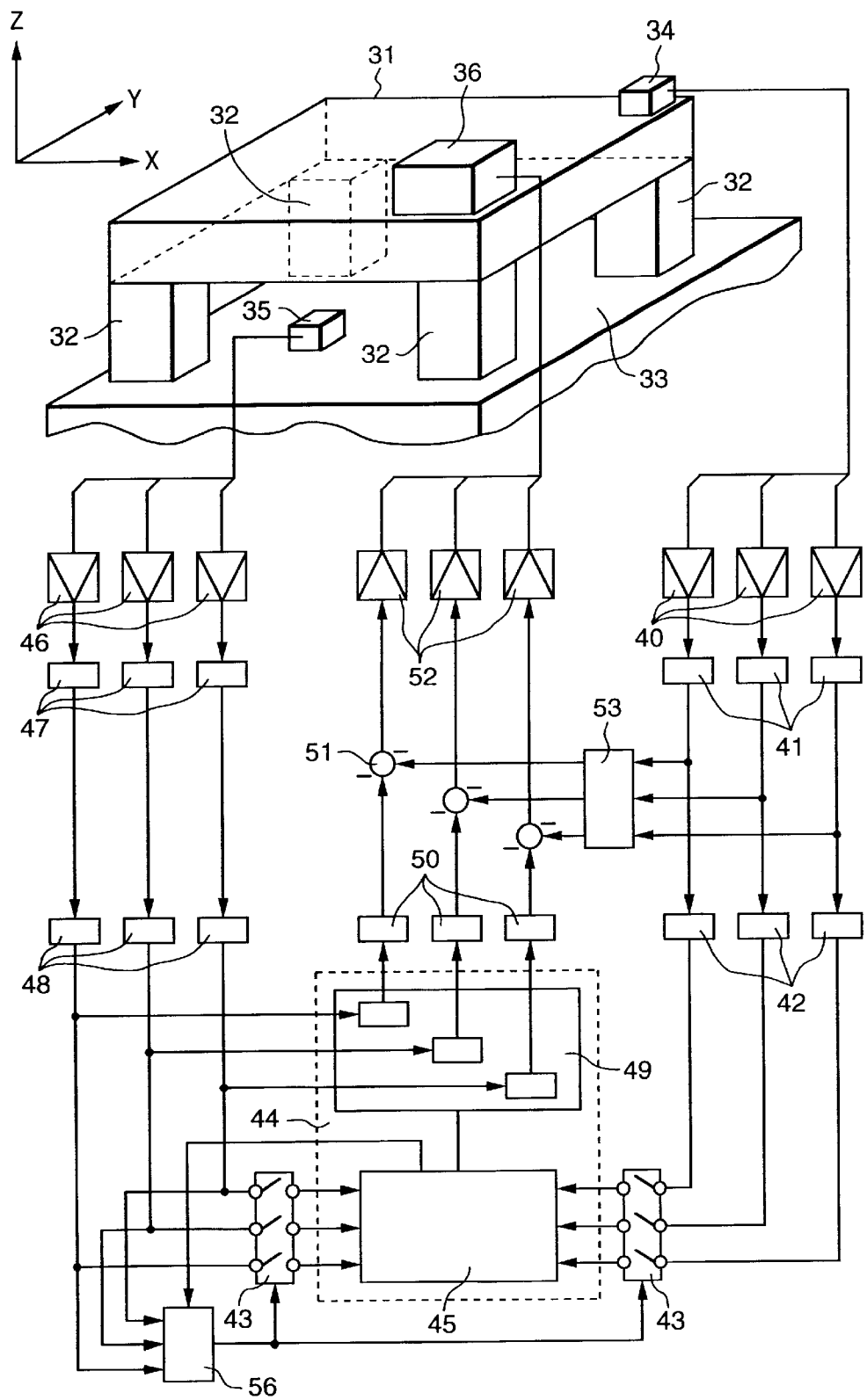
FIG. 5 is a block diagram showing the arrangement of a third modification.

When vibrations on the setting foundation 33 such as a floor become small, the inputs to the parameter estimation mechanism 45 inevitably become small. For this reason, the noise components become dominant, and the parameter estimated values deviate from their optimal values, thus deteriorating the anti-vibration performance. To solve such problem, as shown in FIG. 5, vibrations of the setting foundation 33 are input to a determination mechanism 56, and when it is determined that the vibrations of the setting foundation 33 have become small, parameter estimation may be suspended by outputting an instruction to the operation switching mechanisms 43.

Figure 6:
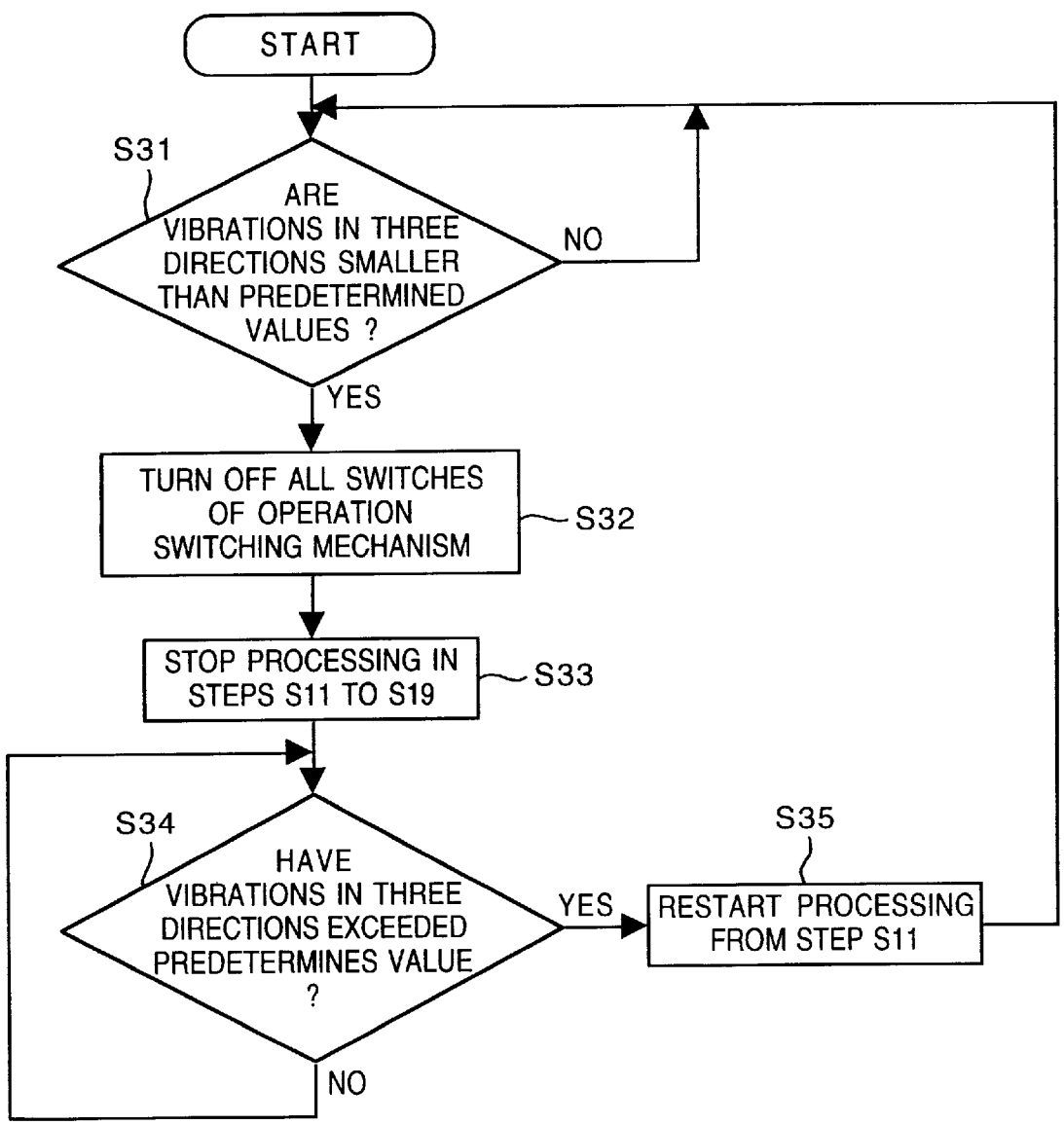
FIG. 6 is a flow chart for explaining the processing of the determination mechanism in the third modification.

In this case, the operation of the determination mechanism 56 is substantially the same as that described above with the aid of FIG. 2. Note that processing based on the vibration information of the setting foundation 33 is added. FIG. 6 is a flow chart for explaining the processing based on the vibration information of the setting foundation 33. This processing is started at the start timing of parameter estimation (i.e., step S13 in FIG. 2) in each direction.

In step S31, the determination mechanism 56 monitors vibration information output from the second vibration detector 35, and checks if vibrations in the three directions on the setting foundation 33 have become smaller than a predetermined value. If YES in step S31, the flow advances to step S32 to turn off all the switches of the operation switching mechanism 43 and to stop the processing shown in FIG. 2 (steps S32 and S33).

In this state, when vibrations in the three directions on the setting foundation 33 exceed the predetermined value again, the determination mechanism 56 restarts the processing in FIG. 2 from step S11 so as to restart parameter estimation, and the flow returns to step S31 (steps S34 and S35).

By providing another determination criterion, not only the influence of interferences from other directions can be reduced, but also the anti-vibration performance of the adaptive filter 44 can be prevented from deteriorating when vibrations on the setting foundation 33 become small.

<Second Embodiment>

Figure 7:
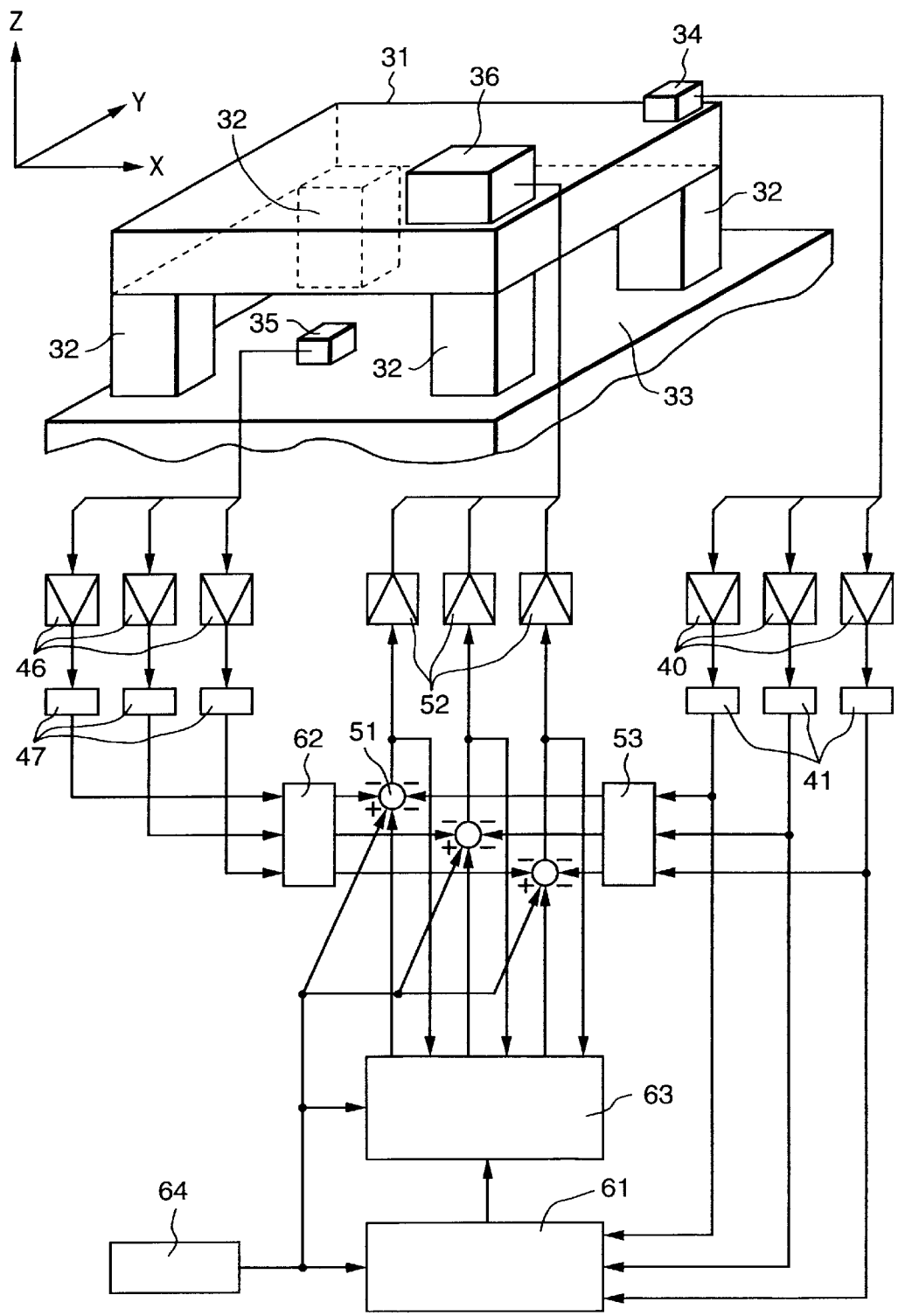
FIG. 7 is a block diagram showing the arrangement according to the second embodiment of the present invention.
Figure 8:
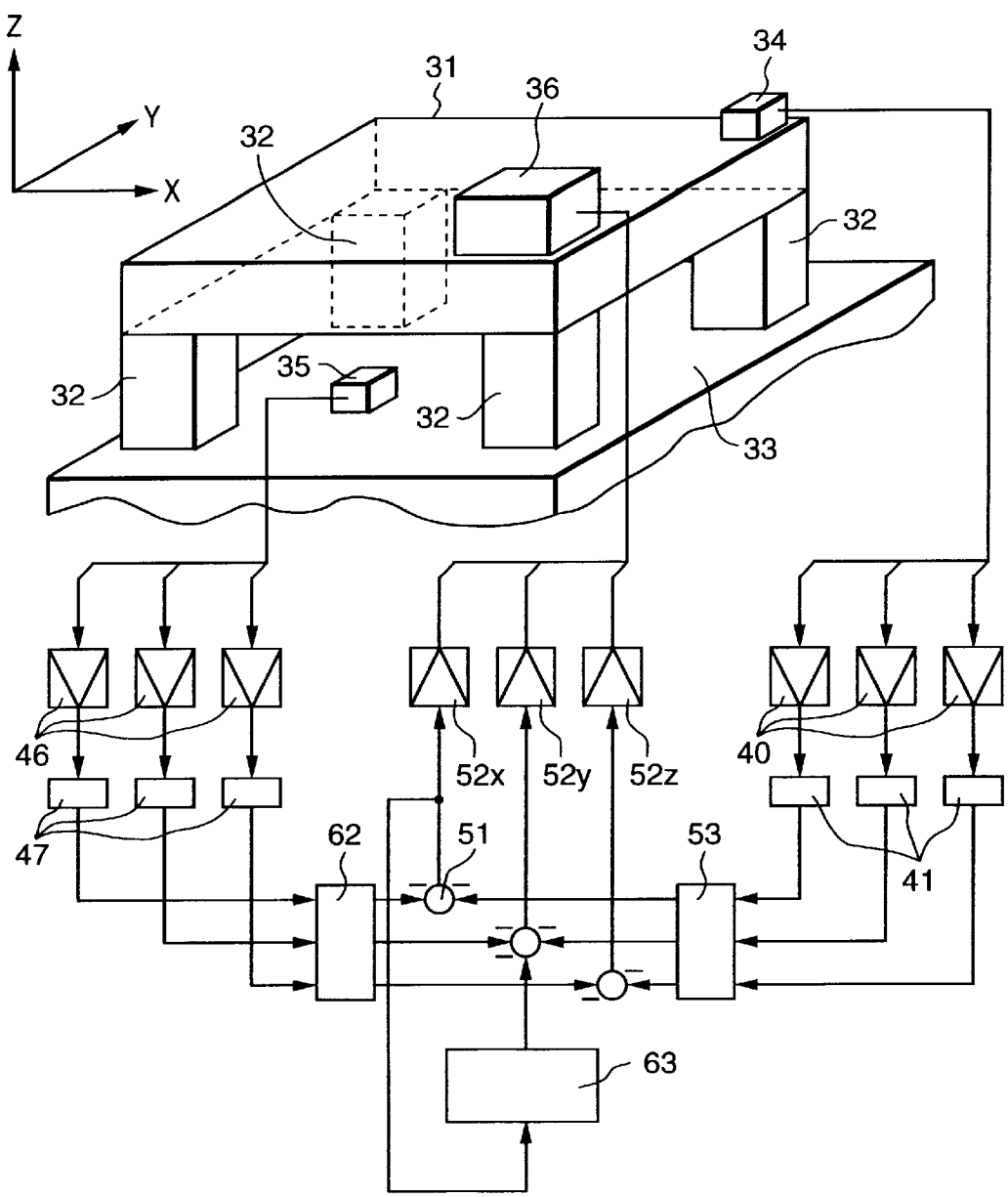
FIG. 8 is a block diagram showing the arrangement of a decoupling loop that cancels an interference from the X-direction to the Y-direction.

FIG. 7 shows the arrangement of an anti-vibration apparatus according to the second embodiment. In the second embodiment, the arrangements of an anti-vibration table 31, support mechanisms 32, actuator 36, first vibration detector 34, and second vibration detector 35 are the same as those in the first embodiment.

The outputs from the first vibration detector 34 are connected to a feedback compensator 53 and an interference characteristic estimation mechanism 61 via amplifiers 40 and band-pass filters 41. On the other hand, the outputs from the second vibration detector 35 are connected to a feedforward compensator 62 via amplifiers 46 and band-pass filters 47. The output from the interference characteristic estimation mechanism 61 is connected to a decoupling compensator 63, and the output from an M-sequence signal generator 64 is connected to the interference characteristic estimation mechanism 61 and the decoupling compensator 63. The outputs from the decoupling compensator 63 are mixed with the outputs from the feedback compensator 53, the outputs from the feedforward compensator 62, and the output from the M-sequence signal generator 64 by mixing circuits 51, and the mixed signals are supplied to the actuator 36 via drivers 52. Note that the outputs from the mixing circuits 51 are fed back to the decoupling compensator 63.

The active anti-vibration apparatus of the second embodiment is made up of an anti-vibration table vibration feedback loop for performing vibration control in consideration of vibrations of the anti-vibration table 31, a floor vibration feedforward loop for performing vibration control in consideration of vibrations transmitted from the setting foundation 33 to the anti-vibration table 31, and a decoupling loop for canceling the influences of interferences in the individual directions.

In the anti-vibration table vibration feedback loop, signals obtained by detecting vibrations of the anti-vibration table 31 vibration-damped by the support mechanisms 32 by the first vibration detector 34 are amplified by the amplifiers 40, and are supplied to the band-pass filters 41 to pass only components in a necessary frequency band to obtain vibration information. The feedback compensator 53 arithmetically operates the obtained vibration information, and feeds back the operation results to the actuator 36 via the drivers 52.

On the other hand, in the floor vibration feedforward loop, signals obtained by detecting vibrations of the setting foundation 33 by the second vibration detector 35 are amplified by the amplifiers 46 and are supplied to the band-pass filters 47 to pass only components in a necessary frequency band to obtain vibration information. The feedforward compensator 62 arithmetically operates the obtained vibration information, and inputs the obtained manipulated variables to the drivers 52 via the mixing circuit 51, thereby driving the actuator 36.

In the decoupling loop, the decoupling compensator 63 calculates a driving signal of the actuator 36 in a given direction, and drives an actuator in another direction. FIG. 7 shows the arrangement for canceling an interference transmitted from the X-direction to the Y direction as an example of the decoupling loop. The decoupling compensator 63 arithmetically operates a driving signal for an actuator in the X-direction input to a driver 52$x$, and inputs the obtained manipulated variable to a driver 52$y$, thereby driving an actuator in the Y-direction in the actuator 36.

Prior to driving the device mounted on the anti-vibration table 31, the characteristics of the decoupling compensator 63 are set. For example, the characteristics of the decoupling compensator 63 for canceling an interference transmitted from the X-direction to the Y-direction are obtained in the following procedure.

Figure 9:
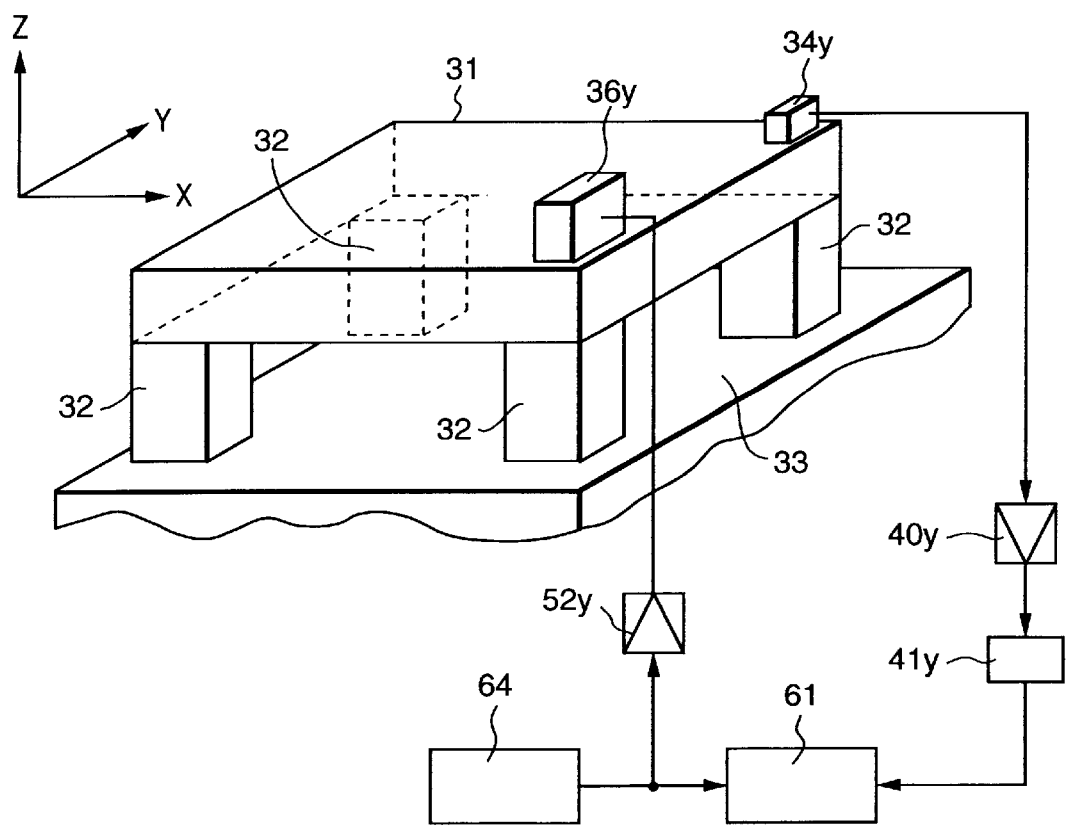
FIG. 9 is an explanatory view of procedure 1 for obtaining decoupling compensation characteristics.

As procedure 1, as shown in FIG. 9, the M-sequence signal generator 64 drives an actuator 36$y$ in the Y-direction, and the decoupling characteristic estimation mechanism 61 estimates characteristics Gyy of vibrations of the anti-vibration table 31 in the Y-direction upon driving in the Y-direction. The characteristics Gyy are given by:

$$Gyy = Gy \cdot Uy \quad (1)$$

where Gy is the main body characteristics of the antivibration table 31 of the anti- in the Y-direction, and Uy is the actuator characteristics in the Y-direction.

As procedure 2, as shown in FIG. 10, the M-sequence signal generator 64 drives an actuator 36$x$ in the X-direction, and the decoupling characteristic estimation mechanism 61 estimates characteristics Gxy of platen vibrations in the Y-direction upon driving in the X-direction. The characteristics Gxy are given by:

$$Gxy = Gy \cdot Txy \cdot Ux \quad (2)$$

where Txy is the interference characteristics from the X-direction to the Y-direction, and Ux is the actuator characteristics in the X-direction.

Decoupling compensation characteristics Hxy that satisfy:

$$Txy \cdot Ux = Hxy \cdot Uy \quad (3)$$

are obtained. Hence, the decoupling compensation characteristics Hxy are expressed by a formula obtained by multiplying equation (2) and the inverse function of the characteristics obtained in procedure 1:

$$Hxy = Txy \cdot Ux/Uy = Gy \cdot Txy \cdot Ux/(Gy \cdot Uy) = Gxy/Gyy \quad (4)$$

The above-mentioned procedures need only be repeated in units of interferences.

As described above, according to the active anti-vibration apparatus of the first embodiment, even when interferences have occurred among the two horizontal directions and vertical direction, the estimated parameter in each direction of the feedforward compensator quickly converges to an optimal value without suffering any interferences from other directions, thus obtaining sufficient anti-vibration performance.

Also, according to the active anti-vibration apparatus of the second embodiment, even when interferences have occurred among the two horizontal directions and vertical direction, the decoupling loop that can cancel an interference can be easily built without using any new actuator or sensor, and sufficient anti-vibration performance can be obtained.

<Third Embodiment>

Figure 11:
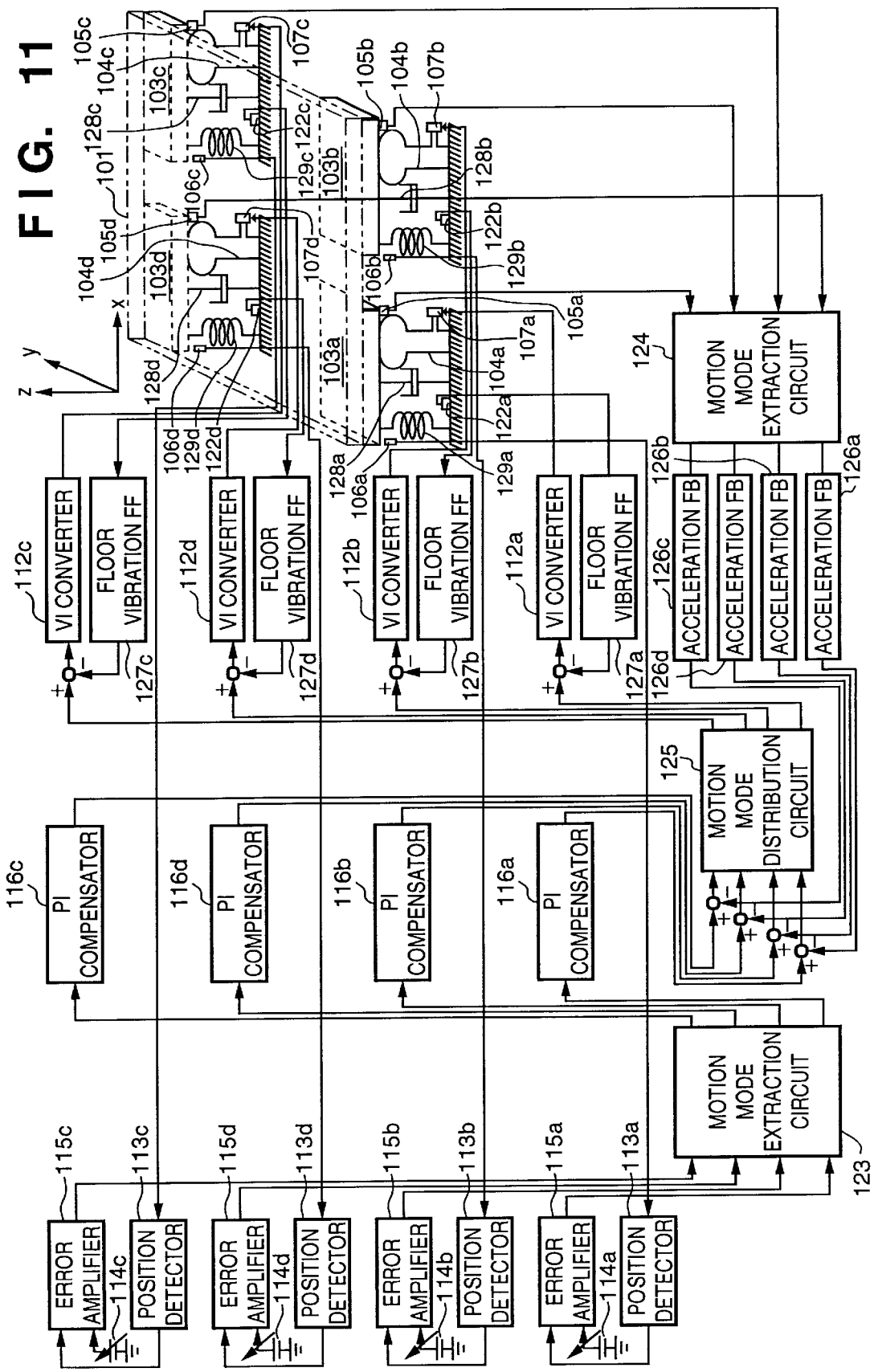
FIG. 11 is a block diagram showing the arrangement of an active anti-vibration apparatus according to the third embodiment of the present invention.

FIG. 11 shows an active anti-vibration apparatus according to the third embodiment of the present invention. In order to explain the arrangement of the third embodiment with the aid of a simple drawing, the following explanation will be given using an active anti-vibration apparatus in which damper support legs 103$a$ to 103$d$ for generating driving forces in the vertical direction are arranged at the four corners of a flat anti-vibration table. Referring to FIG. 11, pneumatic springs 104$a$ to 104$d$ having driving forces in the vertical direction are arranged at the four corners of an anti-vibration table 101. Also, the apparatus comprises a position-related motion mode extraction circuit 123, an acceleration-related motion mode extraction circuit 124, and a motion mode distribution circuit 125 for generating driving forces in the individual axes so as to control a rigid body motion mode including translation in the Z-direction, rotation about the X-axis, and rotation about the Y-axis, and a flexible motion mode including torsional motion of the anti-vibration table 101.

In this embodiment, torsional motion control is built in as an elastic mode. However, this control may be used as needed, and in general, only the control of the rigid body motion mode is required. In this case, outputs from at least three position sensors and vibration sensors are supplied to the position- and acceleration-related motion mode extraction circuits to compensate for three different motion modes, i.e., the translation in the Z-direction, rotation about the X-axis, and rotation about the Y-axis. The signals obtained in correspondence with the individual motion modes are input to a 3-input, 4-output motion mode distribution circuit to drive actuators of the damper support legs.

The control operation of the anti-vibration table 101 will be explained in more detail below. The outputs from vibration sensors 105a to 105d in the damper support legs 103a to 103d arranged at the four corners of the anti-vibration table 101 are supplied to the acceleration-related motion mode extraction circuit 124 to detect the translation in the Z-direction, rotation about the X-axis, and rotation about the Y-axis as rigid body motions, and torsional motion as an elastic motion. The outputs from the circuit 124 are supplied to acceleration feedback compensators 126a to 126d for giving optimal damping amounts in units of motion modes, and the outputs from these compensators are fed back to the input side of the motion mode distribution circuit 125.

As for the position loop, the outputs from position sensors 106a to 106d of the damper support legs 103a to 103d are converted into electrical signals by position detectors 113a to 113d, and the converted signals are supplied to error amplifiers 115a to 115d. These amplifiers 115a to 115d compare the input signals with voltages output from target voltage setting units 114a to 114d to obtain position error signals corresponding to the damper support legs 103a to 103d. These position error signals are supplied to the position-related motion mode extraction circuit 123, to detect the translation in the Z-axis, rotation about X-axis, and rotation about Y-axis as the rigid body motion modes, and the torsional motion as the elastic motion mode. These position-related motion mode signals are input to PI compensators 116a to 116d. In order to attain optimal compensation in units of motion modes, the output signals from the PI compensators 116a to 116d are added to negative feedback signals, which have been appropriately compensated in units of motion modes in association with the acceleration, in units of motion modes, and the obtained signals are input to the motion mode distribution circuit 125. In the above-mentioned decoupling feedback devices in units of motion modes, the acceleration and position characteristics can be adjusted in units of motion modes.

In general, according to the above-mentioned decoupling feedback devices in units of motion modes, the characteristics of the acceleration and position loops can be adjusted in units of motion modes without any interferences. For this reason, since the frameworks of the control loops are based on the motion modes, a floor vibration feedforward loop for canceling vibrations as floor vibrations transmitted to the anti-vibration table can also be prepared in units of motion modes. In this case, a plurality of vibration sensors are set on the floor surface, and motion mode signals associated with floor vibrations corresponding to the motion modes of the anti-vibration table are extracted from the outputs from these sensors. The extracted signals are appropriately compensated, and the compensated signals are fed forward to the input side of the motion mode distribution circuit arranged in a closed loop controller. Since floor vibration feedforward loop has the same framework as that of the closed loop, an apparatus arrangement with high matching characteristics can be realized. At this time, since floor vibration feedforward compensation allows fine adjustments free from any interferences in units of motion modes, the anti-vibration performance in units of motion modes can be sought up to its limit.

However, this arrangement requires another motion mode extraction circuits in correspondence with floor vibrations, and the scale of the anti-vibration apparatus increases unwantedly. Furthermore, as has been described above in the paragraphs of the background of the invention, local vibrations at the damper support legs of the setting foundation cannot be adequately suppressed.

In view of these problems, in this embodiment, vibration sensors, which detect vibrations transmitted there to have floor vibrations as a primary vibration source and are as many as the number of degrees of freedom in driving of each damper support leg, are arranged in the neighborhood of the foot of each damper support leg in units of damper support legs. In FIG. 11, four damper support legs are used, and each has a degree of freedom in driving in one axis, e.g., the vertical direction alone. Hence, vibration sensors 122a to 122d are arranged at the feet of the damper support legs 103a to 103d. The outputs from these sensors are supplied to floor vibration feedforward compensators 127a to 127d that perform optimal compensation in units of damper support legs, and the outputs from these compensators are fed forward to the input side of voltage-current (VI) converters 112a to 112d for driving servo valves 107a to 107d of the individual axes.

The position control of the anti-vibration table 101 based on the outputs from the position sensors 106a to 106d and vibration sensors 105a to 105d is decoupled in units of motion modes, since the position- and acceleration-related motion mode extraction circuits 123 and 124, and the motion mode distribution circuit 125 are arranged. On the other hand, as for the floor vibration feedforward loop, signals obtained by appropriately compensating the outputs from the vibration sensors arranged in the neighborhood of the feet of the damper support legs are independently fed forward.

Figure 12:
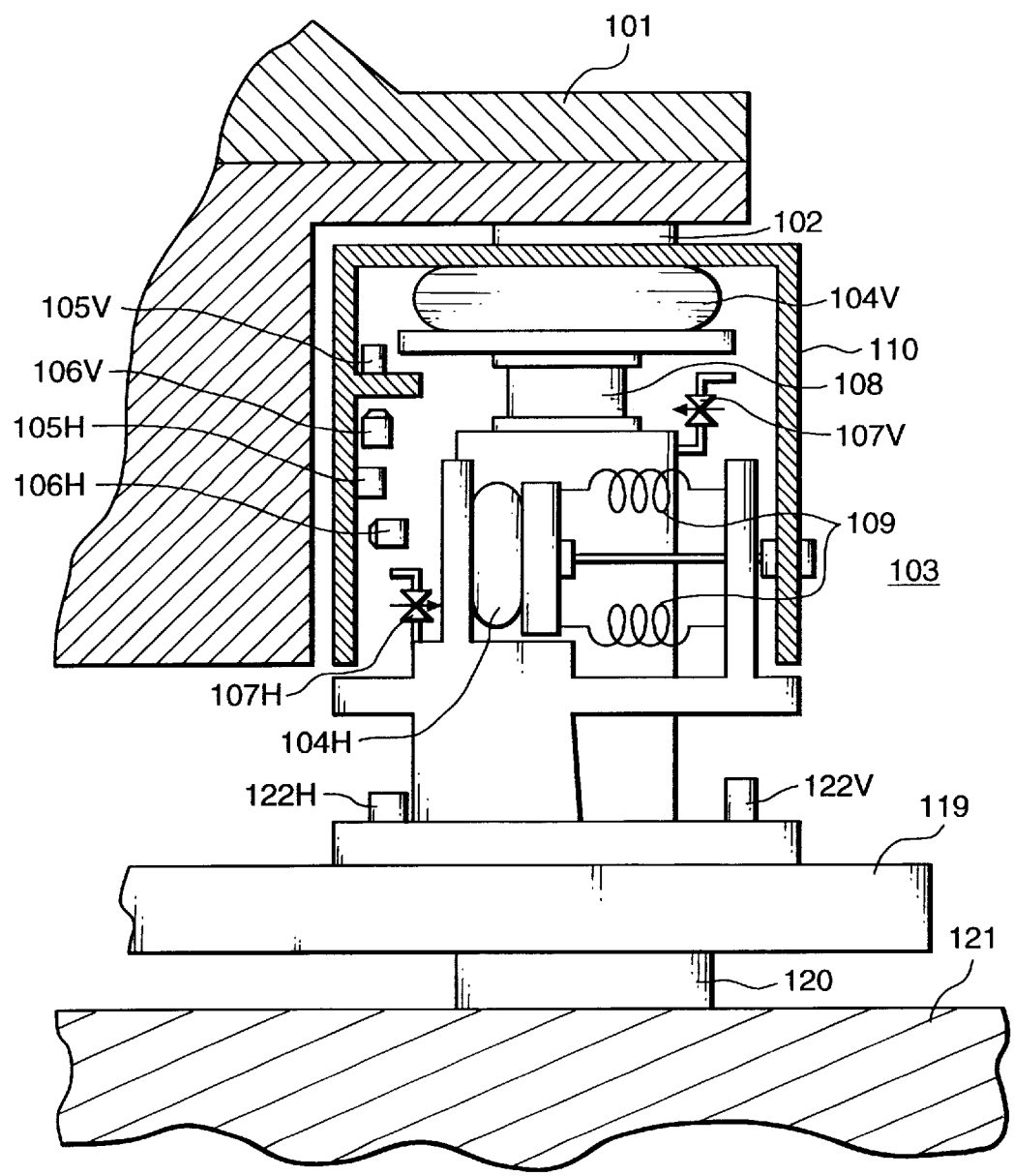
FIG. 12 is a sectional view showing a setting example of vibration sensors at the foot of a damper support leg.

For example, vibration sensors 122 are set at the foot of the damper support leg, as shown in FIG. 12. In FIG. 12, the damper support leg can be driven in the vertical direction and two horizontal directions, and two vibration sensors 122V (H) (vertical (horizontal) direction) are arranged. Both vibrations transmitted to a device setting foundation member 119 via a leveling mechanism 120 for keeping the position of the anti-vibration table 101 with respect to a floor 121, and vibrations produced in the device setting foundation member 119 by a counterforce applied to the member 119 when each damper support leg 103 suppresses vibrations of the anti-vibration table 101 can be detected by the vibration sensors 122V (H) set at the foot of the damper support leg 103. These vibrations are transmitted to the anti-vibration table 101 via the illustrated mechanism members of the damper support leg 103. Hence, the signals detected by the vibration sensors 122V (H) are fed forward to the input side of voltage-current (VI) converters for driving the pneumatic springs 104V (H) as actuators neighboring the damper support leg 103.

Note that reference numerals 128a to 128d denote viscosity elements that express viscosities determined by the pneumatic springs 104a to 104d, mechanical springs 129a to 129d, and the overall mechanism members. The anti-vibration table 101 requires a total of six degrees of freedom, i.e., not only translation in the Z-direction and rotations about the X- and Y-axes, but also translation in the X-direction, translation in the Y-direction, and rotation about Z-axis as rigid body motions. In FIG. 11, actuators, sensors, mechanical member layout, and their control device arrangements for controlling translations in the X- and Y-directions and rotation about Z-axis in the damper support legs are not shown, but they have arrangements similar to those for translation in the Z-axis, and rotations in the X- and Y-axes.

Furthermore, this embodiment is applied to the active anti-vibration apparatus using pneumatic springs as actuators. Also, the present invention can be applied to an active anti-vibration apparatus using electromagnetic actuators represented by voice coil motors and linear motors, an active anti-vibration apparatus using deviation generation type actuators represented by piezoelectric elements, and an active anti-vibration apparatus using combinations of these actuators.

<Fourth Embodiment>

The arrangement shown in FIG. 11 comprises the decoupling feedback devices in units of motion modes to attain position control with respect to the anti-vibration table 101. Hence, it is convenient to prepare the floor vibration feedforward loop in units of motion modes in view of utilizing the frameworks of the closed loops. However, in the third embodiment, floor vibration feedforward arrangements are independently adopted in units of axes in view of improvement of the anti-vibration ratio. Similarly, even when the closed loops of the position control with respect to the anti-vibration table 101 are independently prepared for in units of axes, they do not disturb independent floor vibration feedforward loops in units of axes.

Figure 13:
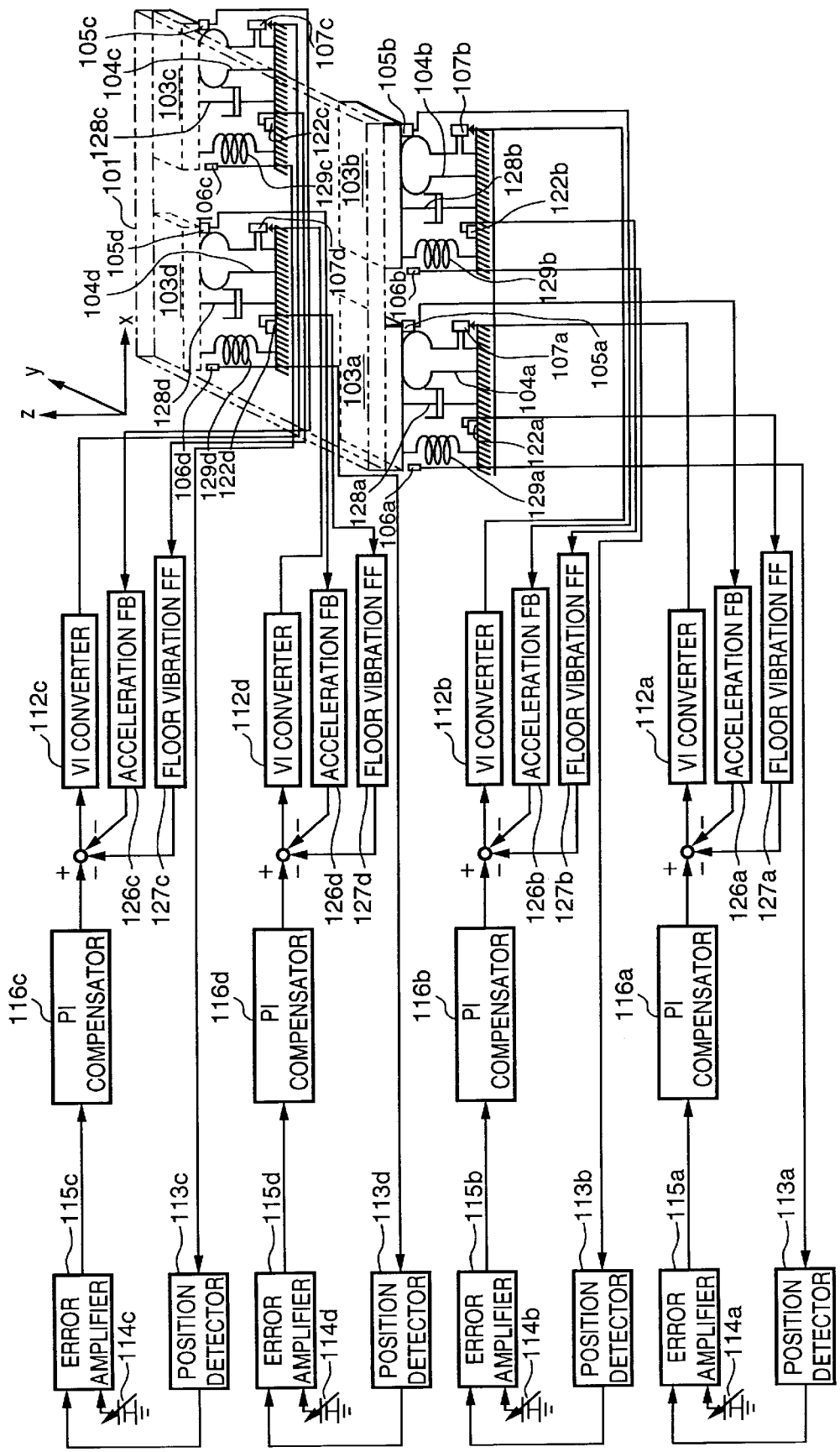
FIG. 13 is a block diagram showing the arrangement of an active anti-vibration apparatus according to the fourth embodiment of the present invention.
Figure 14:
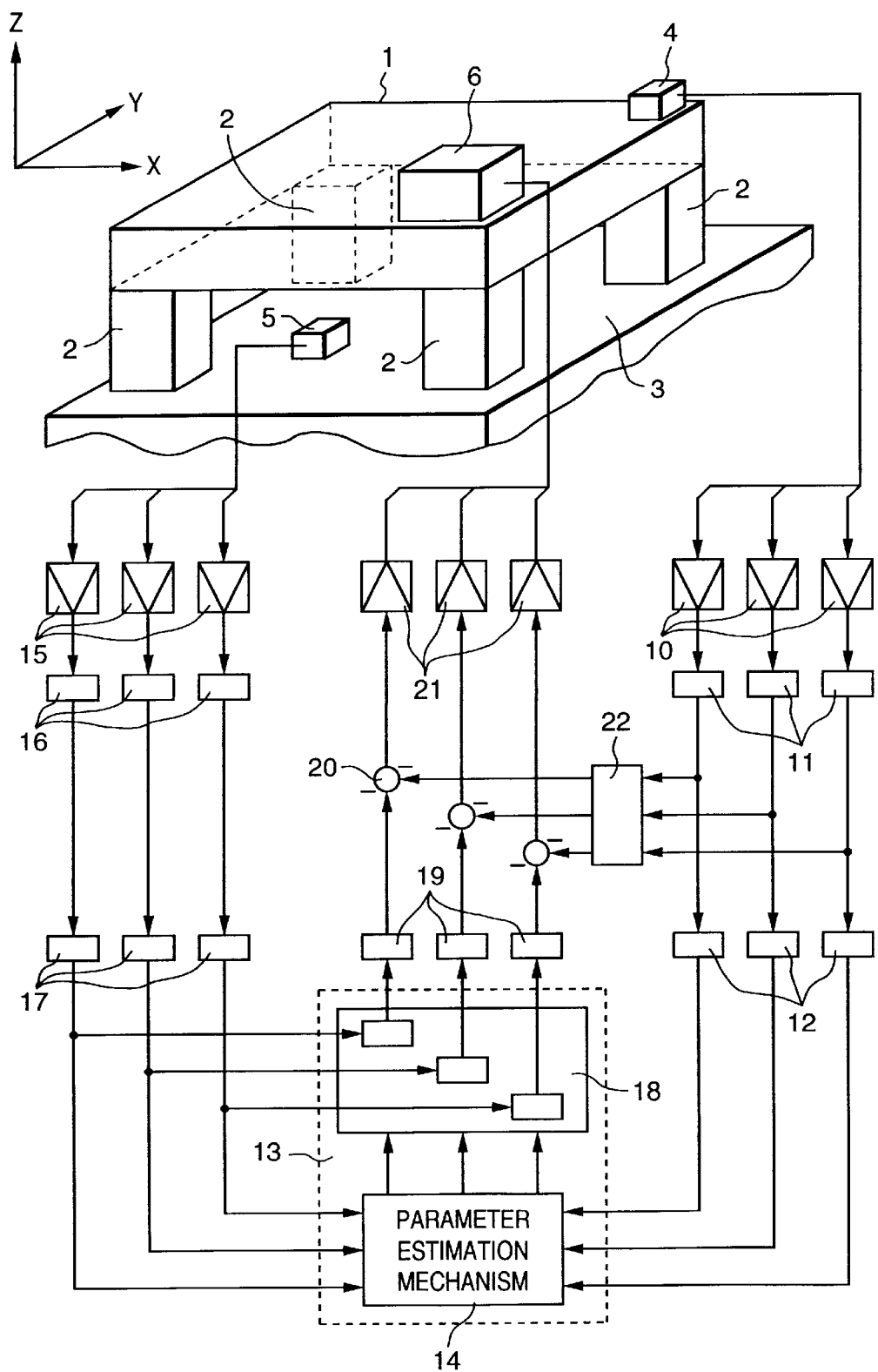
FIG. 14 is a block diagram showing the arrangement of a general active anti-vibration apparatus.
Figure 15:
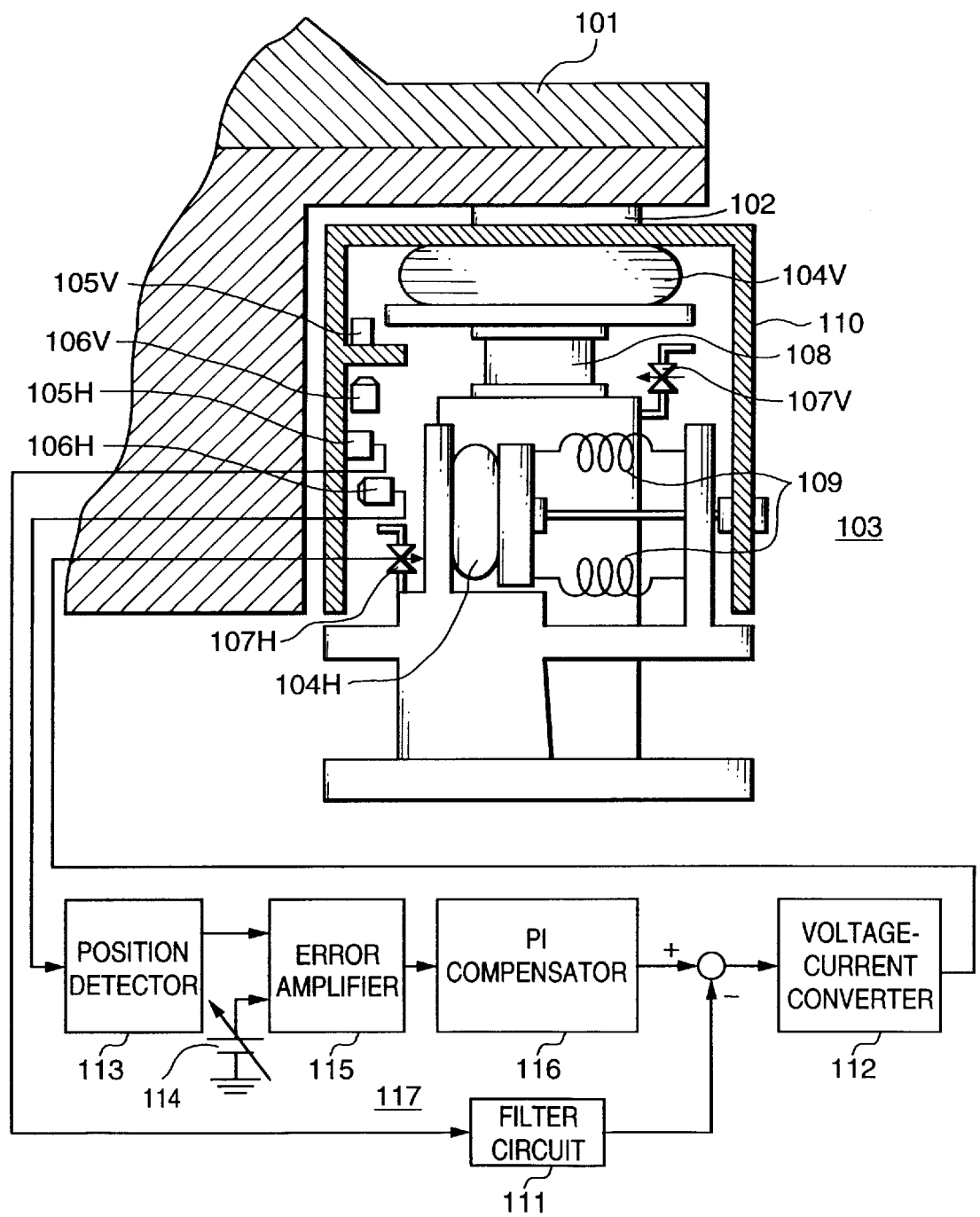
FIG. 15 is a sectional view showing a damper support leg which uses pneumatic springs as actuators.

FIG. 13 shows the arrangement of the fourth embodiment for a control system in the vertical direction as in FIG. 11. In FIG. 13, damper support legs 103a to 103d having driving axes in the vertical direction have independent acceleration and position feedback loops in units of axes. In addition, vibration sensors 122a to 122d arranged at the feet of the damper support legs detect vibrations, and are fed forward to the input side of corresponding voltage-current (VI) converters 112a to 112d to obtain signals via floor vibration feedforward compensators 127a to 127d set with appropriate parameters in units of axes as driving signals of pneumatic springs 104a to 104d as neighboring actuators.

According to the above-mentioned third and fourth embodiments, the following effects are expected.

(1) A vibration sensor is arranged in the neighborhood of the transmission route of floor vibrations, the detection signal from the sensor is appropriately compensated, and the compensated signal is fed forward to the neighboring actuator. Hence, floor vibrations can be optimally shielded in units of damper support legs. As a consequence, since vibration components that enter the anti-vibration table can be reduced, exposure performance in, e.g., a semiconductor exposure device can be improved.

(2) The damper support legs kick the setting surface on the floor side to resist the counterforce produced upon movement of the X-Y stage mounted on the anti-vibration table. For this reason, since the device setting foundation member which is not a perfect rigid body deforms and also receives a dynamic load, it induces local mechanical vibrations, which are transmitted to the anti-vibration table via the damper support legs again. According to the present invention, since vibration sensors are arranged at the feet of the damper support legs on the floor side, such local vibrations can be effectively suppressed.

(3) In other words, since the device setting foundation member need not have high rigidity, its manufacturing cost can be prevented from increasing.

(4) The vibration standard of the floor on which a semiconductor exposure device is set can be relaxed. That is, even when a semiconductor exposure device is set in a building with high vibration level, predetermined performance can be assured.

As many apparently widely different embodiments of the present invention can be made without departing from the spirit and scope thereof, it is to be understood that the invention is not limited to the specific embodiments thereof except as defined in the appended claims.

What is claimed is:

1. An anti-vibration apparatus comprising:

an anti-vibration table;

a plurality of support legs which are arranged between a foundation and said anti-vibration table, support said anti-vibration table, and have actuators for damping vibration of said anti-vibration table;

a generator which generates control signals for driving said individual actuators on the basis of vibration information obtained by detecting the vibration of said anti-vibration table;

a plurality of vibration detectors which detect vibration of the foundation corresponding to a degree of freedom of each actuator;

a compensator which generates compensation signals on the basis of vibrations detected by said plurality of vibration detectors, and compensates the control signals generated by said generator using the compensation signals; and a driver which drives the actuators based on the signals compensated by said compensator.

2. The apparatus according to claim 1, wherein said generator generates control signals for driving said individual actuators by compensating vibration information obtained by detecting the vibration of said anti-vibration table in units of motion modes.

3. The apparatus according to claim 1, wherein said generator generates the control signals on the basis of vibration information obtained by detecting the vibration of said anti-vibration table.

4. The apparatus according to claim 1, wherein an X-Y stage is mounted on said anti-vibration table.

5. The apparatus according to claim 1, wherein each of said actuators uses one of a fluid actuator, electromagnetic actuator, deviation generation type actuator, and combinations of the fluid actuator, electromagnetic actuator, and deviation generation type actuator.

6. The apparatus according to claim 1, wherein said vibration detectors are arrayed in the vicinity of said support legs.

7. A control method for an anti-vibration apparatus, which comprises an anti-vibration table, and plurality of support legs which are arranged between a foundation and the anti-vibration table, support the anti-vibration table, and have actuators for damping vibration of the anti-vibration table, comprising the steps of:

generating control signals for driving the individual actuators on the basis of vibration information obtained by detecting the vibration of the anti-vibration table;

detecting vibration of the foundation corresponding to a degree of freedom of each actuator using sensors;

generating compensation signals on the basis of vibrations detected in the vibration detection step, and compensating the control signals generated in the generation step using the compensation signals; and driving the actuators obtained by the signals compensated in the compensation step.

* * * * *

UNITED STATES PATENT AND TRADEMARK OFFICE
CERTIFICATE OF CORRECTION

PATENT NO. : 6,128,552
DATED : October 3, 2000
INVENTOR(S) : Isao Iwai, et al.

It is certified that error appears in the above-identified patent and that said Letters Patent is hereby corrected as shown below:

Column 4,
Line 1, "Adanti-" should read -- anti- --.

Column 6,
Line 51, "precision" should read -- a precision --.

Column 12,
Line 12, "antivibra-" should read -- anti-vibra- --.

Column 16,
Line 57, "and" should read -- and a --.

Signed and Sealed this

Sixteenth Day of October, 2001

Attest:

NICHOLAS P. GODICI
*Attesting Officer*    *Acting Director of the United States Patent and Trademark Office*